(12) United States Patent
Gooch et al.

(10) Patent No.: US 9,520,332 B2
(45) Date of Patent: Dec. 13, 2016

(54) WAFER LEVEL PACKAGE SOLDER BARRIER USED AS VACUUM GETTER

(71) Applicant: RAYTHEON COMPANY, Waltham, MA (US)

(72) Inventors: Roland W. Gooch, Dallas, TX (US); Buu Q. Diep, Murphy, TX (US); Adam M. Kennedy, Santa Barbara, CA (US); Stephen H. Black, Tennessee Ridge, TN (US); Thomas A. Kocian, Dallas, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/736,042

(22) Filed: Jun. 10, 2015

(65) Prior Publication Data
US 2015/0279755 A1 Oct. 1, 2015

Related U.S. Application Data

(62) Division of application No. 13/939,400, filed on Jul. 11, 2013, now Pat. No. 9,093,444.

(51) Int. Cl.
*H01L 23/48* (2006.01)
*H01L 23/20* (2006.01)
(Continued)

(52) U.S. Cl.
CPC ............. *H01L 23/10* (2013.01); *B81B 7/0038* (2013.01); *B81C 1/00269* (2013.01);
(Continued)

(58) Field of Classification Search
CPC .... H01L 23/10; H01L 23/52; H01L 21/76841;
H01L 23/26; H01L 27/14636; H01L 27/1469; H01L 23/49866; H01L 27/14634; H01L 2224/16; H01L 2924/0002
(Continued)

(56) References Cited

U.S. PATENT DOCUMENTS

| 5,789,859 A | 8/1998 | Watkins et al. |
| 6,252,229 B1 | 6/2001 | Hays et al. |

(Continued)

FOREIGN PATENT DOCUMENTS

| WO | 2006057492 A1 | 6/2006 |
| WO | 2012054687 A1 | 4/2012 |
| WO | 2012062613 A1 | 5/2012 |

OTHER PUBLICATIONS

International Search Report dated Oct. 8, 2014 for Application No. PCT/US2014/045756.

*Primary Examiner* — Dzung Tran
(74) *Attorney, Agent, or Firm* — Lando & Anastasi, LLP

(57) ABSTRACT

An electronic device and methods of manufacture thereof. One or more methods may include providing a lid wafer having a cavity and a surface surrounding the cavity and a device wafer having a detector device and a reference device. In certain examples, a solder barrier layer of titanium material may be deposited onto the surface of the lid wafer. The solder barrier layer of titanium material may further be activated to function as a getter. In various examples, the lid wafer and the device wafer may be bonded together using solder, and the solder barrier layer of titanium material may prevent the solder from contacting the surface of the lid wafer.

4 Claims, 9 Drawing Sheets

(51) Int. Cl.
| | |
|---|---|
| *H01L 21/00* | (2006.01) |
| *H01L 21/30* | (2006.01) |
| *H01L 23/10* | (2006.01) |
| *H01L 23/498* | (2006.01) |
| *H01L 21/768* | (2006.01) |
| *B81B 7/00* | (2006.01) |
| *H01L 23/26* | (2006.01) |
| *B81C 1/00* | (2006.01) |
| *H01L 21/52* | (2006.01) |
| *H01L 27/146* | (2006.01) |

(52) U.S. Cl.
CPC ........ *H01L 21/52* (2013.01); *H01L 21/76841* (2013.01); *H01L 23/26* (2013.01); *H01L 23/49866* (2013.01); *H01L 27/1469* (2013.01); *H01L 27/14636* (2013.01); *B81C 2203/035* (2013.01); *H01L 27/14634* (2013.01); *H01L 2224/16* (2013.01); *H01L 2924/0002* (2013.01)

(58) Field of Classification Search
USPC ........ 257/682, 751, 774, 678; 438/107, 456, 438/109; 53/542
See application file for complete search history.

(56) References Cited

U.S. PATENT DOCUMENTS

| | | | |
|---|---|---|---|
| 6,499,354 | B1 | 12/2002 | Najafi et al. |
| 6,923,625 | B2 | 8/2005 | Sparks |
| 6,988,924 | B2 | 1/2006 | Ramamoorthi et al. |
| 7,315,115 | B1 | 1/2008 | Curtin et al. |
| 7,696,622 | B2 | 4/2010 | Takemoto et al. |
| 7,789,949 | B2 | 9/2010 | Sparks et al. |
| 8,247,771 | B2 | 8/2012 | Ouvrier-Buffet |
| 2002/0000646 | A1 | 1/2002 | Gooch et al. |
| 2004/0053483 | A1* | 3/2004 | Nair et al. .............. 438/540 |
| 2004/0070042 | A1* | 4/2004 | Lee et al. ............... 257/459 |
| 2005/0215045 | A1* | 9/2005 | Rinne et al. ............ 438/614 |
| 2006/0012021 | A1 | 1/2006 | Larson et al. |
| 2008/0017944 | A1* | 1/2008 | Higashi et al. .......... 257/434 |
| 2009/0029500 | A1* | 1/2009 | Wan ........................ 438/51 |
| 2010/0117229 | A1* | 5/2010 | Datta et al. .............. 257/738 |
| 2011/0079425 | A1* | 4/2011 | Baillin et al. ........... 174/521 |
| 2011/0079889 | A1 | 4/2011 | Baillin |
| 2012/0096813 | A1 | 4/2012 | Gooch et al. |
| 2012/0280409 | A1 | 11/2012 | Trautmann et al. |

* cited by examiner

WAFER LEVEL PACKAGE SOLDER BARRIER USED AS VACUUM GETTER

RELATED APPLICATIONS

This application is a division of and claims the benefit under 35 U.S.C. §§120 and 121 of U.S. patent application Ser. No. 13/939,400 filed Jul. 11, 2013, titled WAFER LEVEL PACKAGE SOLDER BARRIER USED AS VACUUM GETTER, which is incorporated herein by reference in its entirety for all purposes.

BACKGROUND

A packaged focal plane array (FPA) may comprise a detector array, an associated reference detector array, a read-out circuit, and a transmissive cover that seals one or more of these structures. The cover may be sealed via a seal structure, such as a seal ring. The seal structure may comprise two components, a first component positioned on the transmissive cover, and a second component positioned on the substrate containing the detector array, reference array, and read-out circuit. The two components may be aligned and soldered together to seal the two components together.

In certain instances, one of the surfaces of the transmissive cover may include an infrared shield that may be made of the same metal (e.g., gold) used to form the two components of the seal structure. Accordingly, the solder used to seal the infrared detector wets to the shield just as it does the seal structure. If the solder migrates out from the seal structure and wets to the shield, the shield may draw more solder onto the shield. This may deplete the solder from the seal and prevent a hermetic seal. Solder extrusion may also cause short-circuiting in the reference detector array. In addition, if molten solder extrudes from the seal area and contacts the silicon surface, a reaction may occur between the silicon and the tin in the solder. The reaction products may degrade the bond line and the reliability of the hermetic seal.

One common method of preventing the solder from wetting to the shield is to make the dimensions of each shield only slightly larger than the dimensions of the corresponding reference detector array. The seal structure is then dimensioned so that there is a sufficient gap between the seal and the shield to prevent solder extruded during a bonding process from wetting to the shield. Extending or providing a barrier layer beyond the area of the seal may also prevent contact between the silicon and the solder.

SUMMARY OF INVENTION

One or more aspects of the present disclosure involve embodiments directed toward a method of fabricating an electronic device. The method can comprise providing a first substrate having at least one cavity and a surface surrounding the at least one cavity, depositing a solder barrier layer of titanium material on the surface of the first substrate, forming a first seal structure on at least one of a portion of the solder barrier layer of titanium material and a portion of the first substrate to form a ring around a perimeter of the at least one cavity, activating the solder barrier layer of titanium material in a vacuum environment to function as a getter, providing a second substrate, the second substrate comprising at least one device attached thereto and a second seal structure, the second seal structure forming a ring around a perimeter of the at least one device, aligning the first seal structure to the second seal structure, such that the at least one cavity of the first substrate is positioned over the at least one device, and bonding the first substrate to the second substrate using solder, wherein the solder barrier layer prevents the solder from contacting the first substrate during the bonding.

In accordance with some embodiments, activating comprises heating the solder barrier layer of titanium material to a temperature in a range of about 200° C. to about 500° C. for a time period in a range of about 10 minutes to about 120 minutes.

In accordance with some embodiments, depositing the solder barrier layer of titanium material includes depositing the solder barrier layer with a thickness of the titanium material being in a range of about 1000 Angstroms to about 10,000 Angstroms.

In accordance with some embodiments, activating the at least one solder barrier layer of titanium material is performed after aligning the first seal structure to the second seal structure.

In accordance with some embodiments, activating the solder barrier layer of titanium material is performed simultaneously with bonding the first substrate to the second substrate.

In accordance with some embodiments, the first seal structure is formed on the portion of the first substrate, and the solder barrier layer of titanium material is formed on the surface of the first substrate and around a perimeter of the first seal structure.

In accordance with some embodiments, the method further comprises depositing at least one layer of barrier material on the surface of the first substrate. In certain further embodiments, depositing the at least one layer of barrier material is performed before depositing the solder barrier layer of titanium material. In some embodiments, the solder barrier layer of titanium material is deposited around a perimeter of the first seal structure. In one or more embodiments, the solder barrier layer of titanium material is deposited such that it overlaps a portion of the perimeter of the first seal structure. In at least one embodiment, the at least one layer of barrier material comprises titanium-tungsten. In various embodiments, the solder barrier layer of titanium material is more porous than the at least one layer of barrier material.

One or more further aspects of the present disclosure are directed to a packaged electronic device. The packaged electronic device can comprise a first substrate having at least one cavity formed thereon and a first surface surrounding the at least one cavity, a second substrate, the second substrate comprising at least one device attached thereto, a first seal structure disposed on the first substrate, a second seal structure disposed on the second substrate and bonded to the first seal structure with solder, such that the first surface faces the second substrate and the at least one cavity is positioned over the at least one device, and a solder barrier including at least one layer of titanium material positioned around a perimeter of the cavity between the solder and the first substrate, the at least one layer of titanium material having been activated to function as a getter.

In accordance with some embodiments, the at least one layer of titanium material is disposed on the first surface of the first substrate and around a perimeter of the first seal structure.

In accordance with some embodiments, the solder barrier is disposed on a portion of the first surface of the first substrate, and the first seal structure is disposed on a portion of the at least one layer of titanium material.

In accordance with one or more embodiments, the solder barrier further includes at least one layer of barrier material positioned around a perimeter of the cavity. In accordance with at least one embodiment, the at least one layer of titanium material is disposed on the at least one layer of barrier material and around a perimeter of the first seal structure.

In accordance with some embodiments, the thickness of the at least one layer of titanium material is in a range of about 1000 Angstroms to about 10,000 Angstroms.

In accordance with various embodiments, the second substrate further comprises at least one reference device attached thereto, and the at least one layer of titanium material is positioned over the at least one reference device.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

By way of introduction, aspects and embodiments provide methods for fabricating an electronic device that incorporates using material capable of functioning as both a solder barrier and a vacuum getter. In some aspects, the material may additionally function as an optical shield. As used herein, the terms "electronic device" and "device" are used interchangeably and are to be understood to encompass semiconductor die, RF devices, MEMS devices, and other electrical components that may be used according to one or more embodiments of the present invention. An electronic device may include or be part of a larger system. Non-limiting examples of electronic devices also include displays and sensor arrays, including detector and reference devices. In certain embodiments, the electronic device may be a MEMS device comprising a sensor element. As used herein, the terms "micro-electromechanical system" and "MEMS" are used interchangeably, and may refer to any one of a variety of MEMS devices. In the following description, the term "MEMS device" is used as a general term to refer to electromechanical devices, and is not intended to refer to any particular scale of electromechanical devices unless specifically noted otherwise. In at least one embodiment, the MEMS device is an uncooled infrared bolometer FPA.

Figure 1:
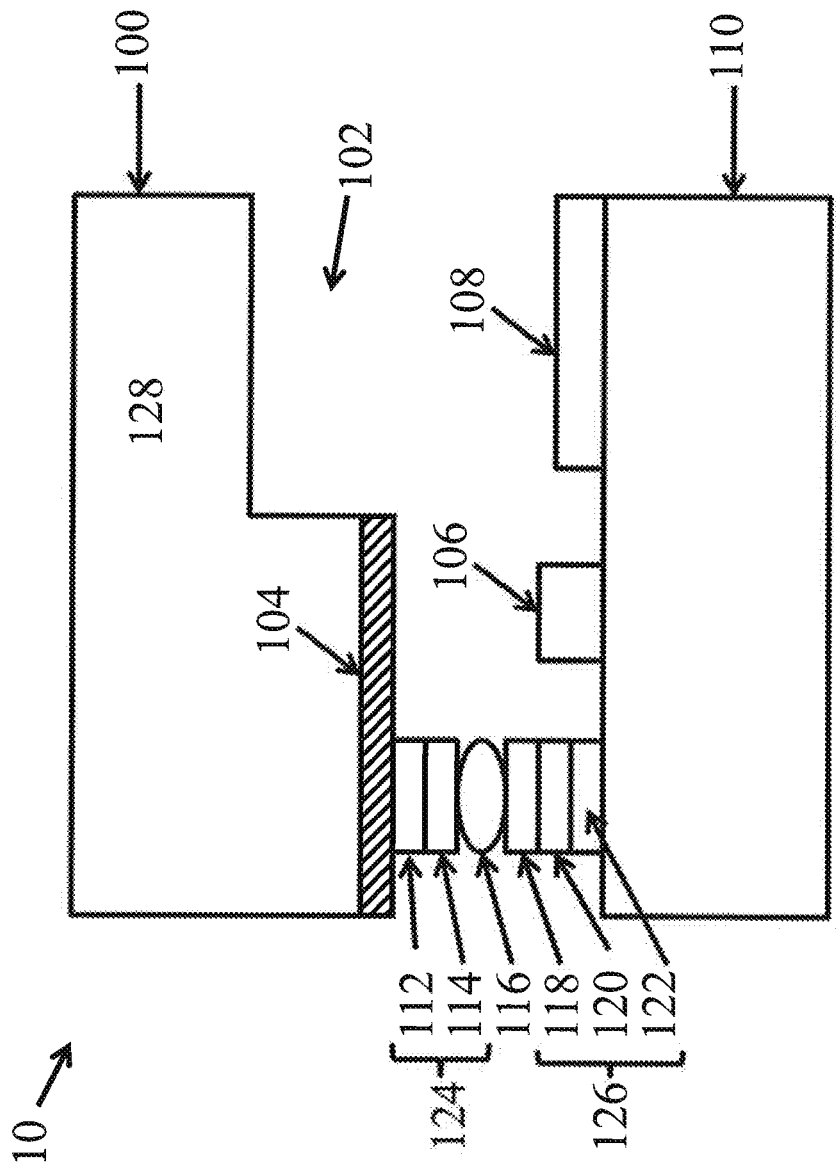
FIG. 1 is a block diagram of a side view of a portion of one example of a packaged electronic device according to aspects of the invention.

FIG. 1 is a block diagram depicting a side view of a portion of a wafer level packaged infrared detector. The packaged infrared detector 10 comprises a portion of a finished (e.g., packaged) electronic device in which a lid wafer 100 has been sealed to a detector wafer 110. Within the sealed cavity 102 are the detector device 108 and the reference device 106. The detector device 108 and reference device 106 may be electronic devices, as described above. In some aspects, the sealed cavity 102 may be hermetically sealed. The lid wafer 100 and the detector wafer 110 may be two components of the packaged infrared detector 10. The detector wafer 110 may comprise a substrate (e.g., a silicon based substrate) that includes any suitable number of detector devices 108 formed thereon. In some embodiments, the number of detector devices 108 may correspond to the number of the cavities 102 in the lid wafer 100.

The lid wafer 100 may function as a cover for a plurality of different detector devices 108 and reference devices 106 formed on the substrate of the detector wafer 110. As discussed further below, the lid wafer 100 and the detector wafer 110 may be aligned such that the lid seal structures 124 are aligned with the detector seal structures 126, such that the cavity 102 is positioned over the detector device 108. The aligned seal structures may be bonded together to seal the detector devices 108 and their corresponding reference devices 106 from the surrounding environment.

The underside of the lid wafer 100 may comprise barrier/getter material 104, which in certain embodiments and as described further below, may also function as an optical shield and as a solder barrier. In certain embodiments, the barrier/getter material 104 may chemically absorb active gases in a vacuum environment. The barrier/getter material 104 may consist of a highly porous and mechanically stable component. According to some embodiments, the barrier/getter material 104 may comprise titanium. The titanium may include a native oxide layer or any other processed oxide layer.

The barrier/getter material 104 may provide at least one of three functions. First, it may function as a barrier to keep the bonding agent that is used to seal the lid wafer to the detector wafer from contacting one or more surfaces of the lid wafer. This barrier capability effectively prevents the occurrence of any metallurgical reaction between the bonding agent and the silicon of the lid wafer. For example, if the bonding agent is solder, the solder may not wet to the barrier/getter material 104. Since the solder will not adhere to the barrier/getter material 104, a seal ring (discussed below) may be placed in close proximity to an array of reference devices 106. Further, the barrier/getter material 104 may be configured to cover only a portion of the lid wafer, and therefore the barrier capability may be contained to areas at the boundary of the seal ring and/or outside this boundary. Second, the barrier/getter material 104 may function as a getter material, to remove undesirable impurities in the sealed cavity 102. As used herein, the term "getter material" refers to a substance that absorbs, adsorbs, or chemically confines or reacts with one or more undesired materials, such as water, oxygen, hydrogen, organic vapor, and mixtures thereof. In both instances, the barrier/getter material 104 may function as a barrier between solder material and silicon. The barrier capability may also prevent lateral permeation of the barrier layer itself, which could possibly degrade the integrity of the vacuum in the sealed cavity 102. In another example, a layer of material functioning as an optical shield may be present on the lid wafer. This layer of material may be constructed from one or more of the same materials used to construct the seal ring, and therefore any bonding agent that extrudes from the seal may also wet onto the optical shield and be drawn out of the seal. By careful placement of the barrier/getter material 104, the non-wettability of the barrier/getter material 104 will keep the extruded solder in the vicinity of the bond line and preserve the integrity of the bond. Third, the barrier/getter material 104 may function as an optical shield, i.e., may function to shield the reference devices 106 from incident radiation being detected by the detector devices 108, as discussed further below.

The lid wafer 100 may comprise a lid substrate 128 and the barrier/getter material 104. The lid substrate 128 may be any suitable silicon (e.g., a Czochralski silicon wafer, a magnetically confined Czochralski silicon wafer, or a float-zone silicon wafer) used to cover and seal the detector device 108. In some embodiments, the lid substrate 128 may include materials other than silicon. According to certain embodiments, the lid substrate 128 may include one or more portions that are transmissive to incident radiation in a variety of wavelengths of infrared light (e.g., light between 3-14 microns in wavelength), and visible light (provided the lid substrate is not silicon). In some embodiments, the transmissive portion of the lid wafer 100 may be between approximately 200 and 725 microns thick. For example, in particular embodiments, the total thickness of the lid wafer 100 may be approximately 500-850 microns thick. In various embodiments, the lid wafer 100 may comprise additional layers. For example, the lid wafer 100 may comprise a layer of float zone silicon or other silicon bonded to a layer of silicon-on-insulator (SoI) material into which the cavities 102 are formed.

The lid wafer 100 may comprise several cavities 102 formed in the lid substrate 128. Each cavity 102 may correspond to a different detector device 108 and may be configured such that the corresponding detector device 108 is able to fit therein (e.g., the length, width and depth of the cavity 102 may be based on the length, width, and height of the detector device 108). The depth of the cavities 102 may vary depending on the thickness of the detector device 108 and/or a desired gap size between the detector device 108 and the lid substrate 128. While the cavities 102 may extend over the corresponding detector device 108, they may not extend over the reference device 106. This may allow the barrier/getter material 104 to shield the reference device 106 from light and/or incident radiation.

The cavities 102 may be formed in the lid substrate 128 by using any of a variety of techniques performed either before or after the barrier/getter material 104 is deposited on the lid substrate 128. For example, in some embodiments, the barrier/getter material 104 may be deposited first, and then the same photolithography mask may be used to etch (e.g., using a deep reactive-ion etching technique) the cavities 102 in both the barrier/getter material 104 and the lid substrate 128. As another example, and as discussed further below, the barrier/getter material 104 may be deposited after the cavities 102 have been formed in the lid substrate 128. In such embodiments, the barrier/getter material 104 may be deposited around the cavities 102, or it may be deposited everywhere and then removed from the cavities 102. Any other technique of depositing the barrier/getter material 104 so that the silicon of the lid substrate 128 is exposed through the cavities 102 may be used.

Depending on the embodiment, the barrier/getter material 104 may be deposited over the lid substrate 128 (or a portion thereof) before the cavities 102 are formed. In some embodiments, the cavities 102 may be formed in the barrier/getter material 104 and the lid substrate 128 using the same photolithography mask. This may reduce the number of manufacturing steps, as compared to using separate masks. The use of the same mask may also allow the barrier/getter material 104 to be deposited right up to the edge of the cavities 102. This may reduce the amount of any internal reflection of light and/or incident radiation that is able to reach the reference device 106.

In some embodiments, the barrier/getter material 104 may have two or more inspection openings (not depicted). The inspection openings may provide a viewing window that may be used to visually check the alignment of the lid seal structure 124 with the detector seal structure 126 before bonding. The inspection openings may also be used to check the alignment after bonding. The inspection openings may be placed at various points around the barrier/getter material 104. For example, in some embodiments, they may be placed around the perimeter of the barrier/getter material 104. As another example, they may be placed proximate to a portion of or proximate to all of the lid seal structure 124.

In one or more embodiments, the lid seal structure 124 may be deposited directly on the barrier/getter material 104. The lid seal structure 124 may form a complete loop or ring around the cavity 102. As discussed previously, the barrier/getter material 104 may be resistive to, or otherwise not bond with a bonding agent used to seal the lid to the detector wafer. For example, if the bonding agent comprises solder, the barrier/getter material 104 may not readily allow the solder to wet to it. The surface tension of the solder may help to keep the solder within the seal structure. This may allow for the distance between the inner edge of the lid seal structure 124 and the reference device 106 and the distance between the inner edge of the lid seal structure 124 and the inner edge of the barrier/getter material 104 to be reduced.

The lid seal structure 124 and the detector seal structure 126 may be two components of a hermetic seal that is used to enclose the detector device 108 and the reference device 106 within a cavity 102 for a packaged infrared detector. In some embodiments, the cavity 102 may be in a state of vacuum. The components of the seal structures may form a closed loop of any shape that surrounds one or more of the components of the infrared detector. Each detector seal structure 126 may surround a corresponding detector device 108 and its associated reference device 106. For example, if the detector wafer comprises twenty detector arrays, then twenty detector seal structures may be formed. Each seal structure may be slightly larger than the size of the detector device and its associated reference device. In the depicted embodiment, the lid seal structure 124 surrounds the cavity 102 and the detector seal structure 126 surrounds the detector device 108 and the reference device 106. As discussed further below, a bonding agent 116 may be applied to one, or both, of the seal structures to form a seal between the lid seal structure 124 and the detector seal structure 126.

The components of the seal structures 124 and 126 may comprise multiple layers of different metals. For example, they may comprise one or more of titanium tungsten (TiW), titanium (Ti), platinum (Pt), nickel (Ni), and gold (Au). Other similar metals may be used and one or more layers may be used. In some embodiments, the lid seal structure 124 may be formed over the barrier/getter material 104, which may function as a barrier layer. In such an embodiment, the barrier/getter material 104 may comprise one or more of the layers of the lid seal structure 124. For example, metal layer 112 may be eliminated from the lid seal structure 124, and replaced by barrier/getter material 104. In certain embodiments, the top layer (e.g., the layer furthest from each respective wafer) may comprise gold, or any other material to which the bonding agent readily bonds.

The detector device 108 may include one or more of any of a variety of different detectors, such as long-wave infrared detectors, short-wave infrared detectors, near infrared detectors, or any other detector capable of capturing images, thermal or otherwise. The type of the detector device 108 used may depend on the intended application for the packaged infrared detector. For example, the packaged infrared detector may be used in video cameras, still image cameras, forward looking infrared systems (FLIRs), and the like. In certain embodiments, the detector device may be a plurality of detectors, such as an array of detectors or a plurality of detector arrays. The plurality of detector arrays may be independent detector arrays formed on a single substrate of a detector wafer. Each detector device may comprise a two-dimensional array of individual detectors. For example, the individual detectors may comprise microbolometers. Particular embodiments may include other types of infrared detectors, or other types of detectors. Each individual detector may be independently responsive to incident radiation. The dimensions of the two dimensional array may vary depending on the intended application. For example, in some embodiments a two-dimensional array may comprise individual detectors arranged in 640 columns by 480 rows. In some embodiments, the detector device may comprise microbolometer detector arrays, where each microbolometer may experience a change in resistance due to a change in temperature caused by incident radiation.

The reference device 106 may comprise one or more detectors, such as an array of detectors that may be functionally similar to the array of detectors used in the detector device 108. However, the number of devices in the reference device 106 may be less than the number of detectors used for the detector device 108, and the reference device may be shielded from light and/or incident radiation. The reference device 106 may be configured to measure the ambient temperature (e.g., the temperature of the substrate on which the detector device is formed) within the cavity 102 and/or of the substrate for the detector device 108. These measurements may be used to calibrate or adjust the readings made by the detector device 108. Each detector device or detector array may include at least one, or in some instances, at least two reference devices. The barrier/getter material 104 may function to shield the reference device 106 from light and/or incident radiation being detected by the detector device 108. This may provide the reference device 106 with a more accurate measurement of the ambient temperature associated with the detectors of the detector device 108.

The lid substrate 128 may be substantially transmissive to light and/or incident radiation in any of a variety of different wavelengths depending on operational needs. This may allow the light and/or incident radiation to reach the detector device 108. The cavity 102 may extend above the detector device 108 but not above the reference device 106. One or more layers of the barrier/getter material 104 may extend up to the edge of the cavity 102. In some embodiments, this may be done by forming the cavity 102 in both the lid substrate 128 and the barrier/getter material 104 using the same photolithography mask. The reference device 106 may be shielded from light and/or incident radiation by the barrier/getter material 104.

The lid wafer 100 and the detector wafer 110 may be sealed together with a bonding agent 116 deposited between the lid seal structure 124 and the detector seal structure 126. The lid seal structure 124 may comprise a stack of layered metals including metal layers 112 and 114. In particular embodiments, the barrier/getter material 104 may comprise titanium. In one or more embodiments, the metal layer 112 may comprise nickel and the metal layer 114 may comprise gold. The detector seal structure 126 may comprise a stack of layered metals including metal layers 118, 120, and 122. In some embodiments, the metal layer 122 may comprise titanium, the metal layer 120 may comprise nickel, and the metal layer 118 may comprise gold. Other materials, such as platinum, may be used as well. Metal layers 114 and 118 may both be made of the same material (e.g., gold). The material used may be one that readily bonds with the bonding agent 116. For example, solder may readily wet to gold.

In certain embodiments, the materials used for the bonding agent 116, the metal layers 114 and 118, and the barrier/getter material 104 may be chosen in concert such that the bonding agent 116 readily bonds to the metal layers 114 and 118, but does not readily bond to the barrier/getter material 104. For example, bonding agent 116 may comprise gold-tin solder (e.g., gold (80%)-tin (20%) solder), the metal layers 114 and 118 may comprise gold, and the barrier/getter material 104 may comprise titanium. Other material combinations may be used depending on operational or manufacturing needs. Since the bonding agent 116 may readily bond with the metal layers 114 and 118, but not the barrier/getter material 104, any bonding agent material that may spread out from the seal structure during bonding may retract back into the seal due to the resistance to wetting characteristic of the barrier/getter material 104 relative to the metal layers 114 and 118.

Figure 2:
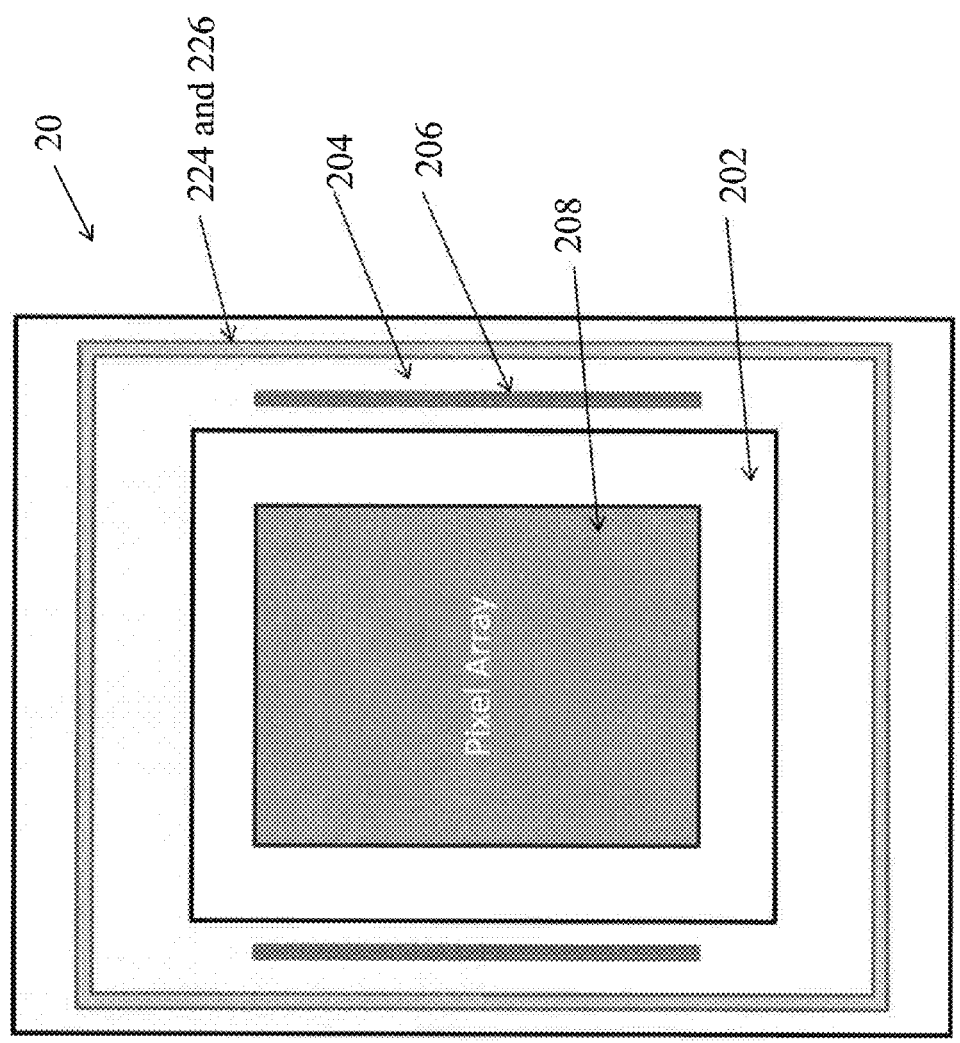
FIG. 2 is a block diagram of a top view of a packaged electronic device according to aspects of the invention.

In another aspect, FIG. 2 depicts a top view of a packaged single infrared detector device. The packaged infrared detector 20 comprises a detector device (pixel array) 208, with the barrier/getter material 204 extending from the outer borders of the lid to the edge of the cavity 202. In certain instances, there may be little or no gap between the barrier/getter material 204 and the cavity 202. This may provide an effective shield for the reference device 206 from light and/or incident radiation. In addition, because there is no concern of the bonding agent adhering to the barrier/getter material 204, the seal structures 224 and 226 may be formed on top of the barrier/getter material 204 at a relatively short distance from the reference device 206. This may allow for a smaller packaged incident radiation detector.

Figure 3:
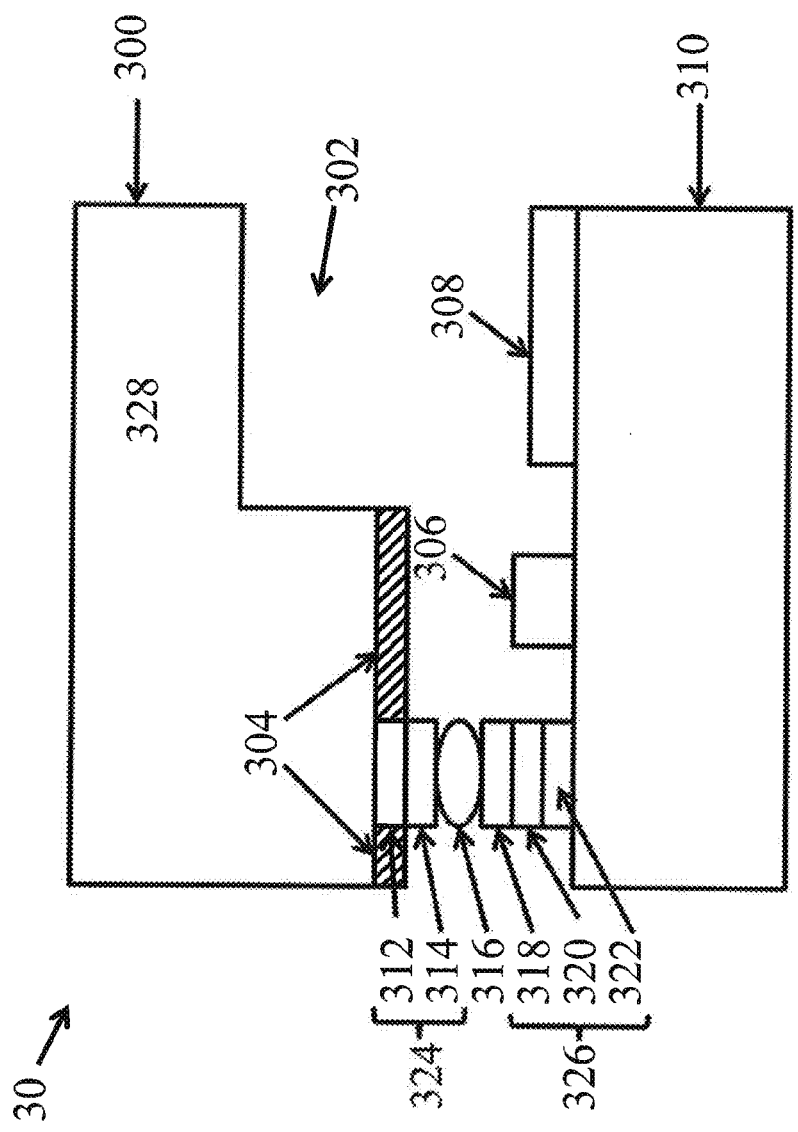
FIG. 3 is a block diagram of a side view of a portion of another example of a packaged electronic device according to aspects of the invention.

According to a further aspect, FIG. 3 is a block diagram of a side view of a portion of a packaged infrared detector similar to FIG. 1. The packaged infrared detector 30 includes a lid seal structure 324 that is formed on the lid substrate 328 before deposition of the barrier/getter material 304. The barrier/getter material 304 may be deposited around a perimeter of the lid seal structure 324 and may extend to the edge of the cavity 302. In the alternative, the barrier/getter material 304 may not extend to the edge of the cavity 302. The barrier/getter material 304 may be deposited up to the very edge of the perimeter of the seal structure 324, or in some instances, may actually overlap a portion of the perimeter of the seal structure 324 by a small amount, to prevent contact of the bonding material with the lid wafer surface. This may be a preferred embodiment if the barrier/getter material 304 is positioned under the seal (rather than metal layer 312) and has a porosity that may lead to leakage under the seal structure 324.

Figure 4:
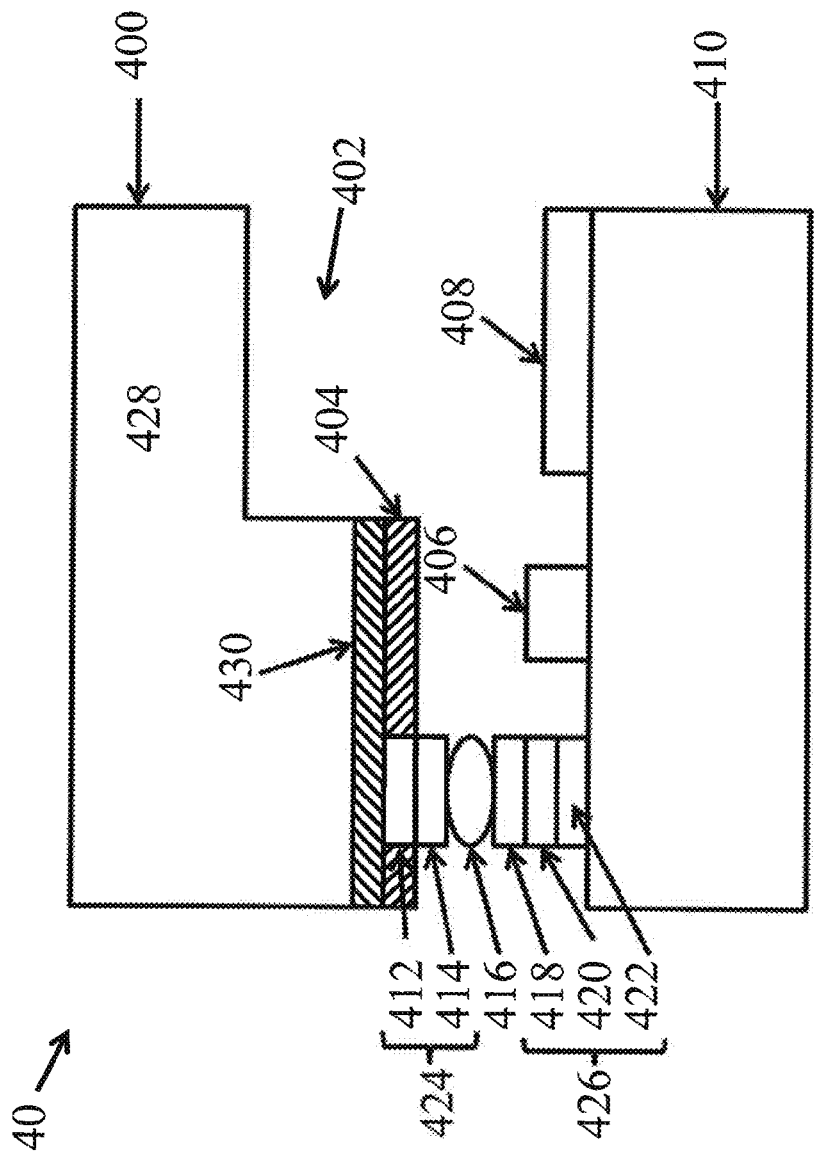
FIG. 4 is a block diagram of a side view of a portion of another example of a packaged electronic device according to aspects of the invention.

In another aspect, FIG. 4 shows a block diagram of a side view of a portion of a packaged infrared detector where a barrier layer 430 is deposited directly onto the substrate. As used herein, the term "barrier layer" refers to a material that prevents the interaction of the bonding material with the silicon surface. The barrier layer 430 may also function as an optical and/or thermal (e.g., infrared) blocking layer when deposited on a surface of the lid substrate 428. In certain instances where an optical shield positioned over the reference devices is constructed from the same metal stack as the lid seal structure 424, extruded bonding material from the seal area may wet onto the optical shield and be drawn out of the bond line. If the barrier layer 430 is not wetted by the bonding material (solder), surface tension will keep the extruded solder in the vicinity of the bond line, and the barrier layer 430 may allow for a smaller spacing between the detector seal structure 426 and the reference device 406. In certain instances, this may allow for smaller infrared detector designs (e.g., smaller die sizes) which may increase the die count of the detector wafer 410. In some embodiments, the barrier layer 430 may comprises titanium-tungsten (TiW), and the TiW may prevent the bonding material, such as solder (e.g., gold (80%)-tin (20%)), from wetting. TiW may also generally be opaque for purposes of blocking light and/or incident radiation (e.g., infrared radiation). This may allow the barrier layer 430 to shield the reference devices 406 from light and/or incident radiation. In certain embodiments, the barrier layer 430 may comprise TiW or any other suitable material that may block incident radiation and may resist bonding with a bonding agent.

In various aspects, a lid seal structure 424 may be deposited onto the barrier layer 430. This configuration may allow the barrier layer 430 to comprise one of the layers of the lid seal structure 424. One or more layers of barrier/getter material 404 may then be deposited onto the barrier layer 430 and around a perimeter of the lid seal structure 424.

Figure 5:
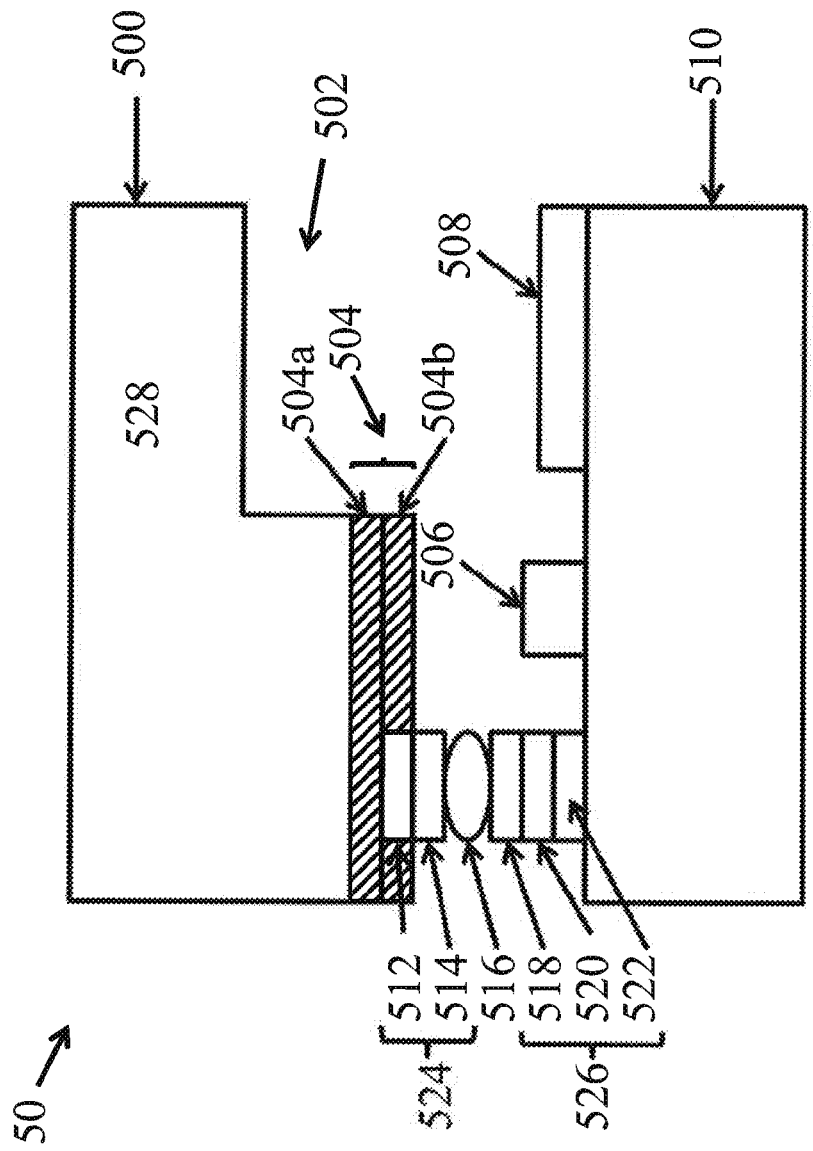
FIG. 5 is a block diagram of a side view of a portion of another example of a packaged electronic device according to aspects of the invention.

In yet another aspect, FIG. 5 illustrates a block diagram of a portion of a packaged infrared detector 50 with a first layer of barrier/getter material 504a deposited on the lid substrate 528. The lid seal structure 524 is then formed on top of the first layer of barrier/getter material 504a. This step is followed by depositing a second layer of barrier/getter material 504b on the surface of the first layer of barrier/getter material 504a and around a perimeter of the lid seal structure 524. In this example, the first layer of barrier/getter material 504a may be included as one of the layers of the lid seal ring 524 and may contribute toward hermetic sealing of the device.

Figure 6:
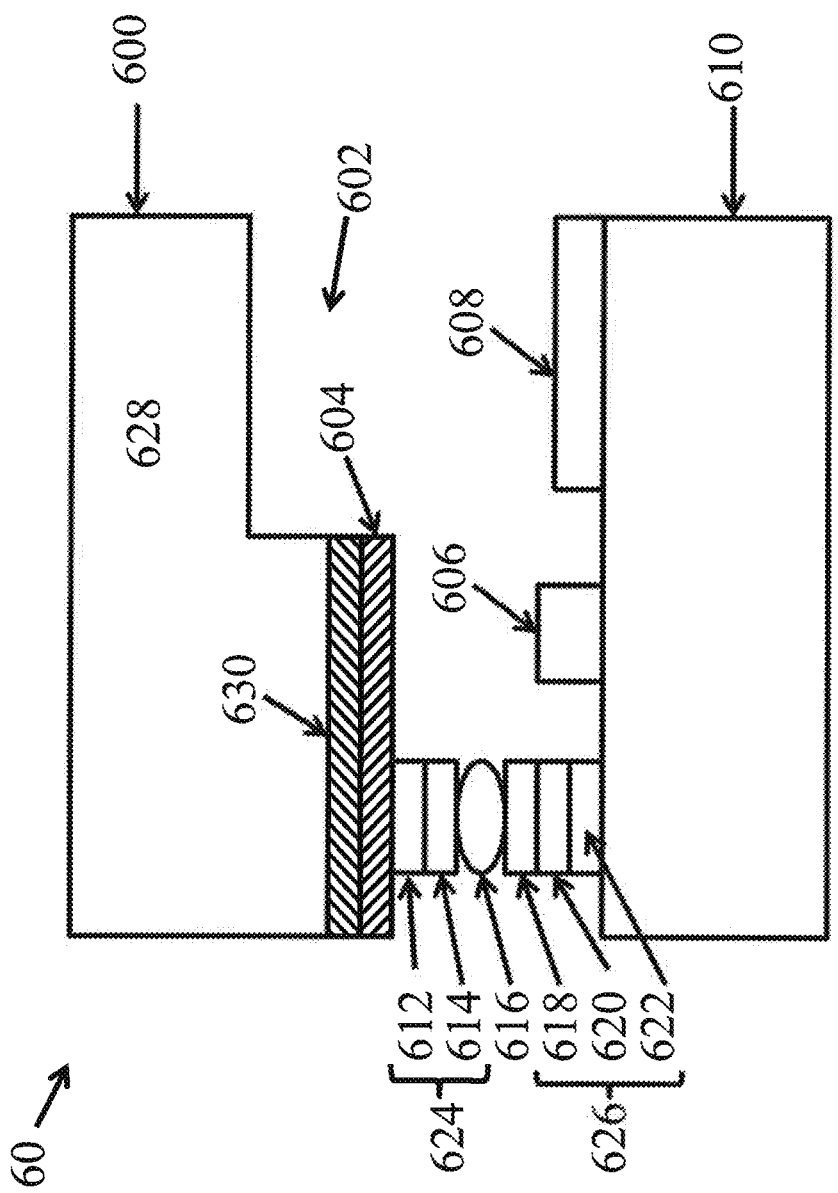
FIG. 6 is a block diagram of a side view of a portion of another example of a packaged electronic device according to aspects of the invention.

According to a further aspect, FIG. 6 is another example of a packaged device that is similar to FIG. 4 with the inclusion of a deposition of a barrier layer 630 on the substrate, but differs in that this step is subsequently followed by the deposition of at least one layer of barrier/getter material 604. Thus, the barrier/getter material 604 is deposited directly onto the barrier layer 630 before the formation of the lid seal structure 624. Both the barrier layer 630 and the barrier/getter material 604 may contribute toward hermetically sealing the device.

Figure 7:
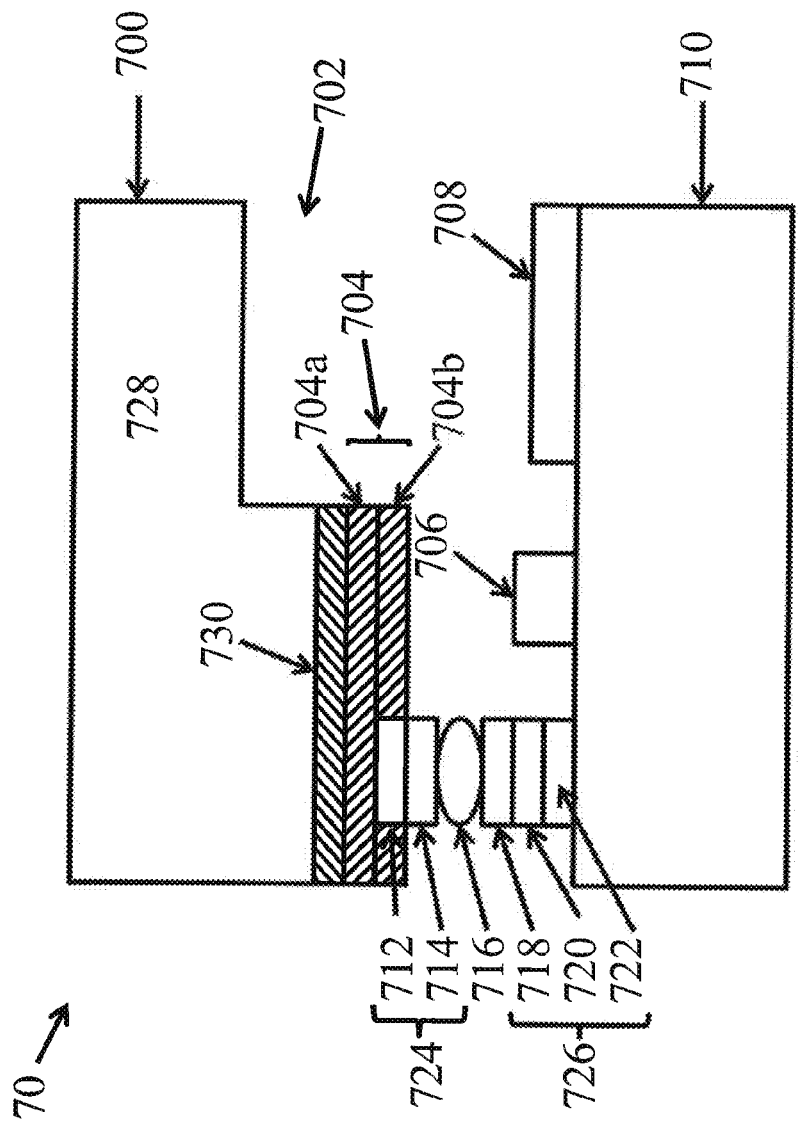
FIG. 7 is a block diagram of a side view of a portion of another example of a packaged electronic device according to aspects of the invention.

In accordance with yet another aspect, FIG. 7 illustrates a block diagram of a packaged device that combines various elements of the structures depicted in FIGS. 4 and 5. In this embodiment, a barrier layer 730 is first deposited on the lid substrate 728. This is followed by the deposition of a first layer of barrier/getter material 704a. The lid seal structure 724 is then formed on the first layer of barrier/getter material 704a. A second layer of barrier/getter material 704b may then be deposited on the surface of the first layer of barrier/getter material 704a and around a perimeter of the lid seal structure 724.

Thus far, several different embodiments and features have been presented. Particular embodiments may combine one or more of these features depending on operational needs and/or component limitations. This may allow for increased adaptability of the packaged infrared detector to the needs of various user environments. As recognized by one skilled in the art, some embodiments may include additional features. It should be noted that while the focus of the description has been based on infrared detectors, other devices such as micro-electro-mechanical systems (MEMS) devices, may comprise similar features (e.g., the use of a layer that is resistive to bonding with a bonding agent) that may benefit from the methods and systems described herein.

Figure 8:
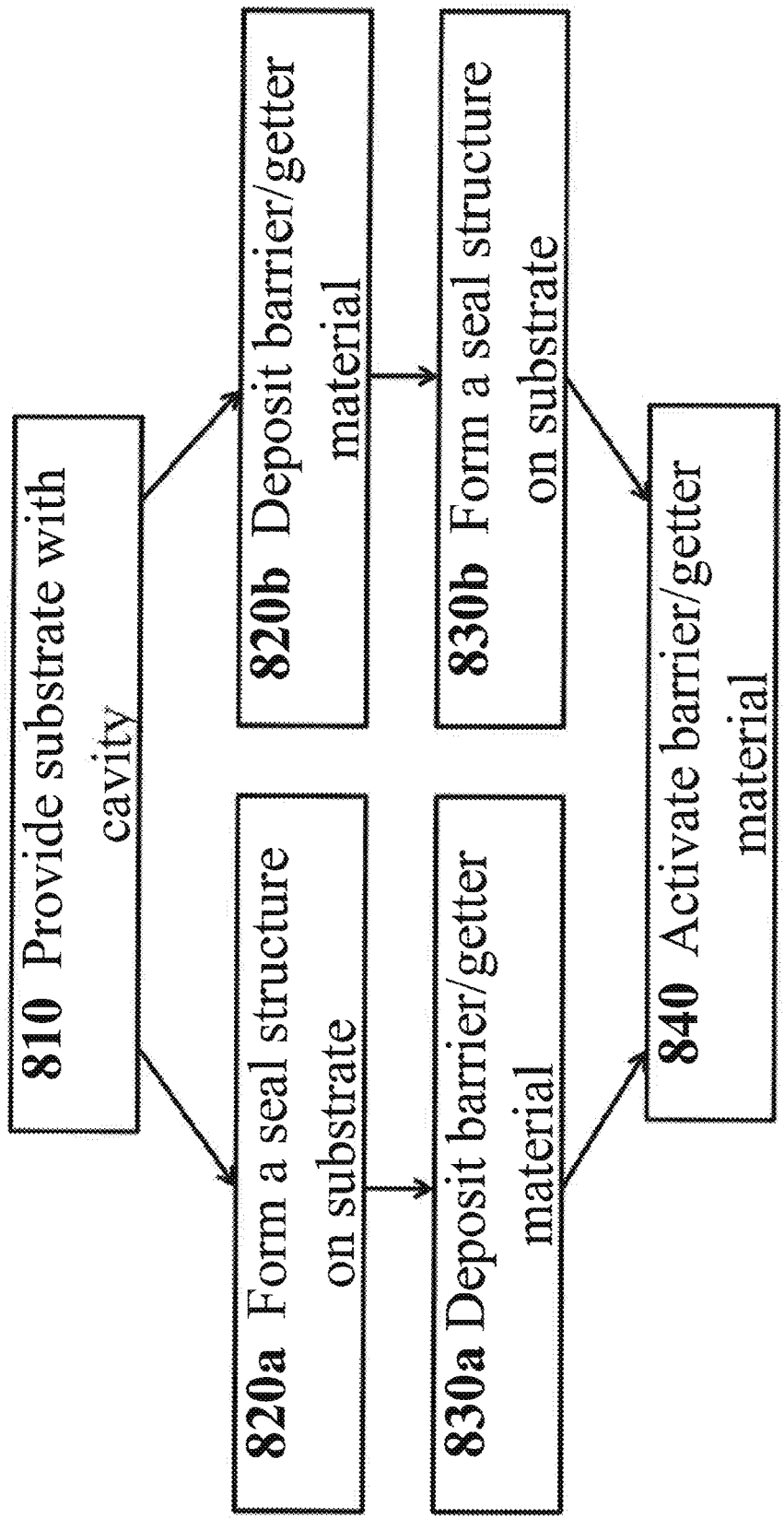
FIG. 8 is a flow diagram illustrating two examples of methods according to aspects of the invention.

FIG. 8 is a flowchart illustrating two methods for performing certain embodiments of the invention. At step 810 a substrate is provided with a cavity. The term "substrate" as used herein, refers to a base or underlying material to which metals and/or additional materials or layers are deposited. Substrates include, but are not limited to, e.g., electronic substrates, metal substrates, ceramic substrates, polymer substrates, and the like, or combinations thereof. Electronic substrates include, but are not limited to, e.g., semiconductors, chips, wafers, and substrates comprised of silicon, and the like, or combinations thereof. Suitable substrates may be comprised substantially of a single or primary material or alternatively of two or more materials selected from, e.g., metals, ceramics, polymers, and the like, or combinations thereof. Ceramics may include, e.g., silicon carbide (SiC) and tantalum nitride (TaN), but are not limited to these specific materials. Polymers may include, e.g., organosilane glass (OSG), low-k dielectrics, siloxanes, methylsilsesquioxanes, polysiloxanes, and other polymers selected from major classes of inorganic, organic, and hybrid polymers. The structure and composition of the substrate is therefore not limited. For example, materials and layers of a substrate may be of any arrangement, order (e.g., sequential, hierarchical, etc.), and/or pattern as suits the intended application, article of manufacture, or composition of matter. For example, semiconductor substrates may comprise silicon, but may comprise, e.g., sapphire in cases where radiation resistance is important, such as in military applications. The substrate may be any material capable of functioning as a supporting structure, including, but not limited to, the semiconductive substrates described above.

In accordance with one or more embodiments, the substrate may include at least one cavity. As used herein, the terms "cavity" and "recess" are used interchangeably and are to be given their broadest ordinary meaning, including but not limited to, a space or hollow area that is surrounded by something such as one or more layers or structures. In certain instances, the cavity may be described as a recess or depression within a wafer material that does not actually extend through the wafer. According to a further aspect, the substrate may have at least one cavity and a surface surrounding the at least one cavity.

In certain instances, the substrate may be a lid substrate. As used herein, the terms "lid substrate," "lid wafer" and "cap wafer" are used interchangeably and refer to a wafer comprising at least one recess that is suitable for use with a device wafer comprising one or more electronic devices, such as MEMS devices. The cavity may include one or more layers of an optically transmissive material. In such a configuration, the lid wafer provides an optically transmissive window above the MEMS devices. The lid substrate may be a thermally and/or optically transparent silicon wafer. In some embodiments, the lid substrate may comprise materials other than silicon.

According to one or more embodiments, at step 820a a seal structure may be formed on a portion of the substrate, or in the alternative, at step 830b, the seal structure may be formed on a portion of the barrier/getter material. For example, the seal structure may form a ring around a perimeter of the at least one cavity. The term "seal structure" is intended to mean one or more structures that can be used to form at least part of a seal for one or more electronic devices within an electrically active area of a substrate from ambient conditions. In various aspects, the seal structure may be used in conjunction with a substrate that includes one or more electronic components to form an encapsulation assembly. The encapsulation assembly may function to substantially protect a portion or portions of the electronic component(s) from damage originating from a source external to the electronic device. In some embodiments, a lid, by itself, or in combination with one or more other objects, may form an encapsulation assembly. The encapsulation assembly may function as a hermetically sealed package.

The seal structure, such as the lid seal structure formed at step 820a, may comprise a stack of metal that includes Ti or TiW, nickel, and gold. In some embodiments, such as in the combination of steps 820b and 830b, the bottom layer of the seal structure stack may comprise the barrier/getter material. For example, if the barrier/getter material is titanium, the bottom layer of the lid seal structure may be titanium and the rest of the stack may include nickel and gold. Each lid seal structure may surround, but be slightly larger than, a cavity in the lid substrate and any window formed in the barrier/getter material. The shape of the lid seal structure may correspond to the shape and size of any detector seal structure formed on a corresponding detector wafer. For example, a seal structure on the surface of the substrate may form a ring around a perimeter of a cavity.

In various embodiments at least one layer of barrier/getter material, such as titanium, may be deposited on a surface of a lid substrate at step 820b. In the alternative, the barrier/getter material may be deposited on the surface of the lid substrate to form a ring around a perimeter of the seal structure, as indicated at step 830a. The barrier/getter material may be deposited on an entire surface of the substrate, or may be deposited on one or more portions of the substrate, for example, through the use of a shadow mask. In certain aspects, the barrier/getter material may be titanium, including pure titanium. According to one or more embodiments, the titanium material may have a thickness in a range of about 1000 Angstroms to about 10,000 Angstroms. According to other embodiments, the titanium material may have a thickness greater than 10,000 Angstroms. The thickness of the titanium material may be any thickness that is suitable for the purposes of function as a getter for a specific application or device. The barrier/getter material may be configured to block light and/or incident radiation to one or more reference devices. In addition, the barrier/getter material may be resistive to bonding with a bonding agent used to form a complete electronic device.

As used herein, the term "layer" is used interchangeably with the term "film" and refers to a coating covering a desired area. The term is not limited by size. Layers and films can be formed by any deposition technique, including vapor deposition, liquid deposition, and thermal transfer.

According to at least one aspect, vacuum evaporation or sputtering methods may be used for purposes of depositing the at least one layer of titanium material. For example, in certain embodiments, titanium material may be deposited under high vacuum conditions in the absence of reactive gases. In one or more aspects, it may be necessary to remove any native oxides present on the substrate surface before depositing the titanium material. Suitable reaction conditions, including reaction atmosphere, reaction temperature, duration of the reaction, and workup procedures may each be chosen based on a specific application, as recognized by one skilled in the relevant technology. In various aspects, the deposition process results in a titanium material that is highly porous, with a maximum surface area and microstructure, i.e., numerous boundaries between the various grains or crystalline structures that constitute the layer.

In various aspects, the at least one layer of titanium material may be characterized as porous. In one or more aspects, the titanium material may be characterized as being more porous than one or more other materials used in the device. For example, the titanium material may be more porous than an underlying barrier layer. The titanium material may be porous for purposes of functioning as a getter. In some instances, the titanium material may have a porosity that may contribute toward leakage if it is positioned in between the silicon substrate of the lid wafer and one or more components of the lid seal structure. In such instances, it may be beneficial to position a layer of barrier material (with a porosity that is lower than the titanium material) directly on the lid substrate to function as a barrier between the layer of titanium and the one or more components of the lid seal structure.

Referring back to FIG. 8, in certain embodiments at step 840 the barrier/getter material may be activated. As used herein, the term "activating," when used in reference to titanium material, refers to any process that may be performed on the titanium material that allows it to function as a getter material. For example, in certain embodiments, the titanium material may be activated by subjecting the device package to a suitable combination of temperature and time. According to certain aspects, activation may occur when device fabrication is complete. In some embodiments, the device package may be hermetically sealed when the barrier/getter material is activated. In other embodiments, the titanium material may be activated during the hermetic sealing process, i.e., bonding or aligning the lid wafer to the device wafer. In certain non-limiting embodiments, the titanium material may be activated by placing the material in a vacuum environment and heating it to a temperature in a range of about 200° C. to about 500° C. for a period of time in a range of about 10 minutes to about 120 minutes. The process involved for activation of the at least one layer of titanium material may be performed under any conditions suitable for causing desorption of any unwanted species in the titanium material and allowing the titanium material to function as a getter and as a barrier as described herein. In some aspects, the titanium material may function as a barrier layer even without the occurrence of activation. In other aspects, the titanium material may function as an optical shield. This functionality may exist either with or without activation. In various aspects, activating results in a barrier/getter material possessing at least one of high porosity, low particulating, and mechanically strong structure.

In various aspects, subsequent processing may be configured to preserve the functionality of the barrier/getter material after activation, for example, so that an exposed surface of the barrier/getter material is still able to react or absorb one or more gas species and thereby function as a getter material. According to certain aspects, specific temperatures and materials used in later processing steps may be specifically chosen to preserve the integrity of the barrier/getter material to function as a getter material. This may include avoiding the use of one or more chemicals (i.e., reactive acids) or environments that may react with the barrier/getter material. For example, after activation the barrier/getter material may only be exposed to vacuum or otherwise oxygen-free environments.

Figure 9:
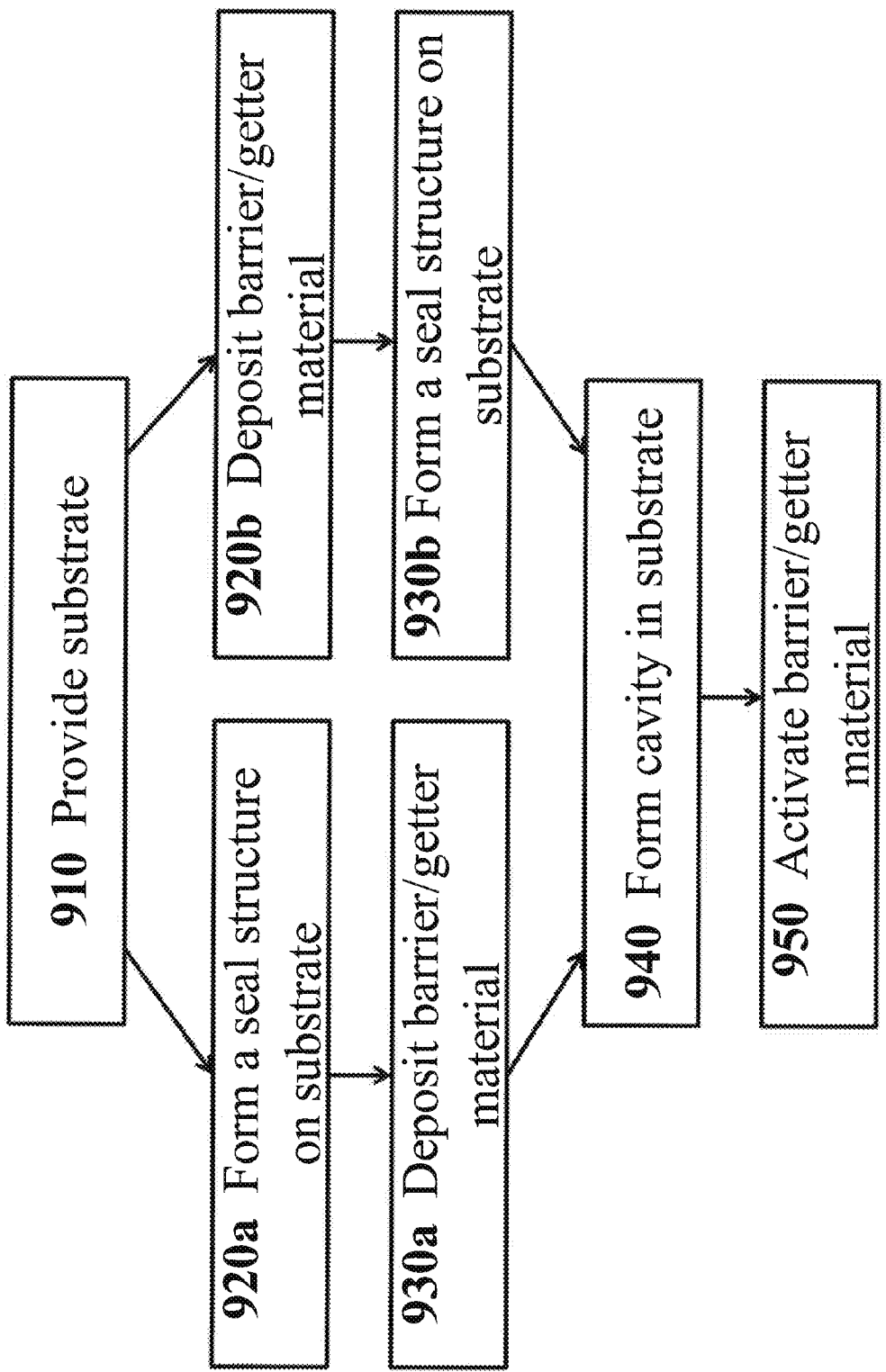
FIG. 9 is a flow diagram illustrating two other examples of methods according to aspects of the invention.

FIG. 9 also illustrates two methods for performing certain embodiments of the invention, and is similar to the method outlined in FIG. 8, with the exception that the substrate is not provided with a cavity. At step 910 a substrate, such as a lid substrate, is provided. In step 910a, a seal structure may be formed on the substrate, or, in the alternative, the seal structure may be formed after the deposition of barrier/getter material (step 920b) at step 930b. In step 920b, barrier/getter material may be deposited on the lid substrate, or, in the alternative, the barrier/getter material may be deposited on the surface of the lid substrate to form a ring around a perimeter of the seal structure, as indicated at step 930a.

At step 940, one or more cavities may be formed by removing portions of the lid substrate and/or barrier/getter material. For example, at least one layer of barrier/getter material, such as titanium material, may be deposited on a substrate and subsequently the at least one layer of titanium material and the substrate may undergo an etching process wherein a cavity is formed in the substrate. In other instances, lid seal rings may be deposited either before or after the deposition of the barrier/getter material, and the cavity may then be formed thereafter. In various embodiments, a cavity or other features to be created on a substrate may be formed by using photolithography techniques. For example, a photoresist mask may applied to the at least one layer of barrier/getter material to define a pattern, such as a cavity, that is to be etched into the substrate and the barrier/getter material. In a further example, the pattern may include a plurality of windows in the barrier/getter material and a plurality of cavities in the lid substrate. The number of windows and cavities may correspond to the number of detector arrays, and both the windows in the barrier/getter material and the cavities in the lid substrate may be formed from the same photoresist mask. This may help to ensure that at least two of the dimensions of both a window in the barrier/getter material and the cavity in the lid substrate are substantially similar and that the barrier/getter material extends right up to the edge of the cavity in the lid substrate. The use of the same mask may also reduce the number of steps needed to manufacture the packaged infrared detector.

The cavity may be formed by removing a portion of the barrier/getter material, a portion of the lid substrate, or both. One or more processes, as recognized by one skilled in the art, may be used to form the cavity, such as, for example, an etch process. In certain instances, the cavity may extend through a portion of the total thickness of the lid substrate and leave at least some of the lid substrate to cover a detector device. Activation of the barrier/getter material may occur at step 950, after the formation of the cavity, as described above.

Some of the steps illustrated in FIGS. 8 and 9 may be combined, modified or deleted where appropriate, and additional steps may also be added to the process flow. Additionally, steps may be performed in any suitable order without departing from the scope of particular embodiments. The steps depicted in FIGS. 8 and 9 are just examples of the steps performed for particular embodiments, and other embodiments may use different steps arranged in a different order. For example, in some embodiments, the cavity may be formed in the lid substrate after the deposition of both a barrier layer and a layer of barrier/getter material on the surface of the lid substrate. Furthermore, seal structures may be formed on the combination of the barrier layer and a layer of barrier/getter material, or the seal structures may be formed on the barrier layer with the layer of barrier/getter material forming a ring around a perimeter of the seal structures. The cavity may be subsequently formed in the lid substrate.

According to one or more embodiments, a method of fabricating an electronic device may include depositing at least one barrier layer on the surface of the substrate. In certain non-limiting embodiments, the at least one barrier layer may be titanium-tungsten. In certain embodiments, the barrier layer may not bond with a bonding agent used, for example, to seal a lid wafer to a detector wafer. In various embodiments, the barrier layer may function to shield one or more reference devices from incident radiation being detected by one or more detector devices. In other instances, the barrier layer may function to shield the barrier/getter material from contamination, such as from contamination or unwanted species in the underlying substrate.

In various embodiments, a method for fabricating an electronic device may further comprise aligning a first seal structure on a first substrate to a second seal structure on a second substrate. In certain aspects the first substrate may include a lid wafer and the second substrate may be a device wafer. The alignment may be performed so that at least one cavity formed on the first substrate may configure to at least one detector device formed on the second substrate. As used herein, the term "configure," when used in reference to alignment, refers to positioning one or more features or elements of a first substrate in a position in reference to one or more features or elements of a second substrate so that the one or more features are allowed to function properly. For example, the cavity on the first substrate may be configured so that a perimeter surrounding the cavity may be positioned over and around a perimeter of the detector device. Such an arrangement allows light penetrating the cavity to be detected by the detector device. In a further example, the detector seal structures may be aligned with the lid seal structures. In various embodiments, aligning the detector seal structure and the lid seal structure may allow windows in the barrier/getter material and cavities in the lid substrate to be aligned with the detector device. This may allow for a thermally and/or optically transmissive window to cover the detector device. Such an arrangement may provide protection for the detector device while still allowing light and/or incident radiation to reach the detector device. Furthermore, because the barrier/getter material may cover the lid wafer, except for the cavity portions, the barrier/getter material may block a portion of light and/or incident radiation from reaching the reference device.

According to certain embodiments, the method of fabricating an electronic device may further comprise bonding the first substrate to the second substrate. As used herein, the term "bonding" may be used interchangeably with the term "sealing" and is intended to mean to permanently affix one surface to another. Bonding may include applying a bonding agent to a lid seal structure, a detector seal structure, or both. The bonding agent may be any type of bonding material that may be used to seal the detector wafer to the lid wafer. For example, the bonding agent may be solder, such as gold-tin solder (e.g., gold (80%)-tin (20%) solder). In certain embodiments, the bonding agent may be such that it adheres to the detector seal structure and lid seal structure, but does not adhere to or bond with the barrier/getter material. For example, in the case of solder, the bonding agent may readily wet to a detector seal structure and a lid seal structure, but may not wet to the barrier/getter material. Furthermore, in instances where a barrier material is used, the barrier material may be resistant to bonding with a bonding agent. For example, the barrier material may be a metal such as titanium, titanium-tungsten or titanium nitride, to which melted solder does not wet.

Bonding the lid wafer to the detector wafer may create a sealed volume within which the detector device is sealed. In some embodiments in which solder is used as the bonding agent, bonding a lid wafer to a detector wafer may comprise melting the solder so that it is in a liquid state. In the liquid state, the solder may spread onto the barrier/getter material. However, because the barrier/getter material does not bond with the bonding agent (e.g., the solder may not readily wet to the barrier/getter material), as the solder begins to cool, it may draw back within the seal structure and thereby decrease, or eliminate, the spread of solder beyond the seal structure. This may allow the seal structure to be closer to the reference detector arrays and/or the detector arrays.

Although particular embodiments have been described in detail, it should be understood that various other changes, substitutions, combinations, and alterations may be made hereto without departing from the spirit and scope of the disclosure. It is intended that particular embodiments encompass all such changes, substitutions, variations, alterations, and modifications as falling within the spirit and scope of the appended claims. For example, although an embodiment has been described with reference to a number of elements included in a packaged infrared detector, such as cavities, detector devices, reference devices, seal structures, barrier layers, barrier/getter material, and bonding agents, these elements may be combined, rearranged, modified or re-positioned in order to accommodate particular detection or manufacturing needs. In addition, any of these elements may be provided as integrated internal or separate external components to each other where appropriate. Particular embodiments contemplate great flexibility in the arrangement of these elements as well as their internal components.

What is claimed is:

1. A method of fabricating an electronic device comprising:
   providing a first substrate having at least one cavity and a surface surrounding the at least one cavity;
   depositing a solder barrier layer of titanium material on the surface of the first substrate;
   forming a first seal structure on a portion of the surface of the first substrate to form a ring around a perimeter of the at least one cavity, wherein the solder barrier layer of titanium material forms a perimeter around the first seal structure such that the solder barrier layer of titanium material does not extend into the first seal structure, the perimeter defining the portion of the surface of the first substrate that the first seal structure is disposed on;
   activating the solder barrier layer of titanium material in a vacuum environment to function as a getter by heating the solder barrier layer of titanium material to a temperature in a range of about 200° C. to about 500° C. for a time period in a range of about 10 minutes to about 120 minutes;
   providing a second substrate, the second substrate comprising at least one device attached thereto and a second seal structure, the second seal structure forming a ring around a perimeter of the at least one device;
   aligning the first seal structure to the second seal structure, such that the at least one cavity of the first substrate is positioned over the at least one device; and
   bonding the first substrate to the second substrate using solder, wherein the solder barrier layer prevents the solder from contacting the first substrate during the bonding.

2. The method of claim 1, wherein depositing the solder barrier layer of titanium material includes depositing the solder barrier layer with a thickness of the titanium material being in a range of about 1000 Angstroms to about 10,000 Angstroms.

3. The method of claim 1, wherein activating the at least one solder barrier layer of titanium material is performed after aligning the first seal structure to the second seal structure.

4. The method of claim 1, wherein activating the solder barrier layer of titanium material is performed simultaneously with bonding the first substrate to the second substrate.

* * * * *